United States Patent [19]
Stein

[11] Patent Number: 5,875,274
[45] Date of Patent: Feb. 23, 1999

[54] OPTOELECTRONIC TRANSMISSION-RECEPTION DEVICE

[75] Inventor: Karl-Ulrich Stein, Unterhaching, Germany

[73] Assignee: Siemens Aktiengesellschaft, Munich, Germany

[21] Appl. No.: 716,530

[22] Filed: Sep. 19, 1996

[30] Foreign Application Priority Data

Sep. 20, 1995 [DE] Germany .......................... 195 34 936.9

[51] Int. Cl.$^6$ ................................ G02B 6/30; H01S 3/19
[52] U.S. Cl. ................................. 385/49; 385/14; 385/37; 372/50
[58] Field of Search ........................... 385/14, 37, 49–51, 385/31; 372/50, 45, 46, 49

[56] References Cited

U.S. PATENT DOCUMENTS

| 3,952,265 | 4/1976 | Hunsperger ........................... 372/50 |
| 4,045,120 | 8/1977 | de Corlieu et al. . | |
| 4,601,535 | 7/1986 | Tanaka et al. . | |
| 5,031,188 | 7/1991 | Koch et al. ........................... 372/45 |
| 5,392,308 | 2/1995 | Welch et al. ........................... 372/50 |
| 5,392,372 | 2/1995 | Kurata et al. . | |
| 5,617,439 | 4/1997 | Kakimoto ........................... 385/49 |

FOREIGN PATENT DOCUMENTS

| 0 495 559 A1 | 7/1992 | European Pat. Off. . |
| 44 04 756 A1 | 8/1995 | Germany . |
| WO 88/05970 | 11/1988 | WIPO . |
| WO 94/11930 | 5/1994 | WIPO . |

OTHER PUBLICATIONS

Patent Abstract of Japan, vol. 10, No. 264, (P–495), dated 09 Sep. 1986 & JP–A–61–090108 dated 08 May 1986.

*Primary Examiner*—Hemang Sanghavi
*Attorney, Agent, or Firm*—Hill & Simpson

[57] ABSTRACT

An optoelectronic transmission-reception device has a semiconductor laser and reception diode fashioned monolithically integrated in a semiconductor chip whose laser resonator is formed by two outer limiting surfaces of the semiconductor chip arranged opposite one another. The laser light emitted by the semiconductor laser is incident into a light waveguide coupled to one limiting surface of the semiconductor chip at the light waveguide side. The coupling of the light waveguide to the semiconductor laser and reception diode fashioned monolithically integrated in the semiconductor chip is fashioned such and the limiting surface of the semiconductor chip at the light waveguide side is of such a nature that, given an adequately low reflectivity of the laser emission emitted by the laser that is required for adequate assurance of the laser function, an optimally large part of the radiation received via the light waveguide is incident into the semiconductor laser and reception diode.

19 Claims, 3 Drawing Sheets

OPTOELECTRONIC TRANSMISSION-RECEPTION DEVICE

BACKGROUND OF THE INVENTION

The present invention is directed to an optoelectronic transmission-reception device that, in particular, can be utilized as transmission-reception transducer for half-duplex operation.

Since the medium of optical fiber (light waveguide) has largely replaced the copper cable in the long-distance network and trunk line network in communications transmission technology, the introduction of optical fiber technology in the subscriber circuit domain is an important task in coming years. The subscriber circuit domain represents the most cost-intensive domain of the telecommunication networks. This fact leads to efforts on the part of the network operators to find a solution that is cost-neutral and future-proof compared to the copper line. Different design possibilities for a transmission architecture in the subscriber circuit domain are being currently investigated. In one architecture considered to possibly have good prospects, the transmission between a terminal equipment at the exchange side (OLT=optical line termination) and a plurality of network termination at the subscriber side (ONU=optical network unit) ensues in the form of a star network with passive distribution that, given a realizable subscriber line length of about 10 km, represents an advantageous concentration of the number of subscribers at a switching center. In this design possibility for a point-to-multipoint connection, the optical fiber can be conducted up to the home of the subscriber in a preferred distribution structure (FTTH, fiber to the home, i.e. the network termination ONU of the subscriber side is located in the home). What is referred to as the TDM/TDMA method (time division multiplexing/time division multiple access), for example, is a suitable transmission method given such an architecture. A time-division multiplex frame is transmitted to all ONUs in the direction to the subscriber (downstream) (TDM). The individual ONUs then access their channels in the completely received frame. In the direction from the subscriber (upstream), the individual ONUs transmit their data bursts to the OLT in a predetermined sequence (TDMA).

Half-duplex operation wherein transmission or, respectively, reception is carried out in chronological succession at one end of the light waveguide is advantageous for data rates into the range of 150 and more megabits per second. Optoelectronic transmission-reception transducers for operation at the end of a light waveguide are still in an early stage of employment. Their costs, however, are of critical significance for the spread of the concept of fiber to the home (FTTH). Particularly for data rates in the indicated range, half-duplex operation or, respectively, what is referred to as ping-pong operation wherein transmission or, respectively, reception is carried out in chronological succession at one end possibly allows a more cost-beneficial structure of the transmission-reception module than given full-duplex operation.

SUMMARY OF THE INVENTION

It is an object of the present invention to provide an optoelectronic transmission-reception device available for half-duplex operation that is simple to manufacture and, in particular, that is fashioned monolithically integrated and that works satisfactorily particularly in view of the efficiency in the reception mode as well as in view of the transmission properties, particularly in view of the efficiency in the transmission mode.

It is inventively provided that the coupling of the light waveguide to the semiconductor laser and reception diode fashioned monolithically integrated in the semiconductor chip is fashioned such and the limiting surface of the semiconductor chip at the light waveguide side is of such a nature that, given an adequately low reflectivity of the laser emission emitted by the laser that is required for adequate assurance of the laser function, an optimally large part of the radiation received via the light waveguide is incident into the semiconductor laser and reception diode. It can thereby be provided in a development of the inventive solution that the limiting surface of the semiconductor chip at the light waveguide side has an essentially nearly completely dereflected surface or, respectively, a surface having a substantially complete optical transmissivity for the radiation received via the light guide. An inventive improvement of an optoelectronic transmission-reception device is for providing such a low reflectivity at the side of the laser (that particularly represents a Fabry-Perot type) facing toward the fiber that an adequately permissible laser function that the incoming reception power proceeds optimally completely into the laser channel.

In a development of the present invention, this can be improved to the effect that the light waveguide or, respectively, fiber is coupled optimally well to the transmission-reception device. To this end, it can be particularly provided that the coupling of the light waveguide to the limiting surface of the semiconductor chip at the light waveguide side has a thin matching layer applied to a surface of the limiting surface of the semiconductor chip at the light waveguide side that faces toward the light waveguide. This matching layer is of such a nature or, respectively, has such a material that an optimally large part of the radiation received via the light waveguide is incident into the semiconductor laser and reception diode. An especially beneficial coupling of the light waveguide for the purpose of a high incoming reception power derives when the material of the thin matching layer applied to that surface of the limiting surface of the semiconductor chip at the light waveguide side that faces toward the light waveguide has a refractive index of at least approximately the geometrical average of the values of the refractive index of the semiconductor laser and reception diode and of the refractive index of the material of the light waveguide. In a specific development, for example, it can be provided that the refractive index of the material of the matching layer has a value from about 1.5 to about 3.0 given a value the refractive index of the semiconductor chip material of about 3.3 to about 3.8 and a reflective index of the material of the light waveguide of about 1.4 to about 1.6.

It can be additionally provided that the material of the matching layer has a low optical absorption coefficient.

The back end of the laser should be highly reflective mirrored, so that the limiting surface of the semiconductor laser facing away from the light waveguide is provided with a surface that is highly reflective for the laser light.

The material of the matching layer can thereby be beneficially selected such that it also has beneficial mechanical and chemical properties in addition to the suitable optical properties, particularly a low absorption for the received radiation. The material, thus, should preferably be inert relative to the neighboring materials, should be chemically stable, and have a suitable consistency such that fabrication-conditioned tolerances can be compensated or, respectively, a mechanically durable, uniform filling of the space between the outer limiting surface of the semiconductor chip and the end of the light waveguide to be coupled [thereto] is assured.

In another preferred embodiment of the invention, it can be provided that a field transformer for adapting the optical light output field from the spatial dimensions of the light exit face of the laser to the entry face of the coupled light waveguide is provided between the light-emitting end of the semiconductor laser and that limiting surface of the semiconductor chip facing toward the end of the light waveguide. Due to the improved adaptation of the optical output field, such a field transformer enables an overall reduction of the emitted or, respectively, received dissipated powers. In a specific embodiment having a diameter of the fiber core of about 9 μm and a slightly larger diameter of the optical output field of about 10 μm, the field transformer enables an adaptation to the geometry of the laser channel with typical dimensions of 0.1μ through approximately 0.2 μm in height and about 2 μm through 3 μm in width.

It can be provided in another advantageous development of the invention that a field transformer for adapting the optical light output field from the spatial dimensions of the light exit face of the laser to the entry face of the coupled light waveguide is provided between the light-emitting end of the semiconductor laser and that limiting surface of the semiconductor chip facing toward the end of the light waveguide.

In a particular embodiment of the invention, the monitor diode usually required in laser operation can be omitted in that the power level at the reception diode is acquired at the other end of the light waveguide and a correction quantity that is potentially required is communicated, for example, to the appertaining transmitter from time to time with a control cell, said transmitter automatically readjusting the transmission power via an evaluation of this information supplied by a correspondingly fashioned evaluation circuit. When the optoelectronic transmission-reception device is employed in a passive optical network with many subscribers, such a device will come into consideration first and foremost for the subscribers. The appertaining information about the power of the individual subscriber can thereby be output from the exchange end, addressed to the individual subscribers.

In another preferred embodiment, what is referred to a DFB laser (distributed feed back laser) can be employed for the semiconductor laser and reception diode fashioned monolithically integrated in the semiconductor chip, this being distinguished by a cross-rifled resonator (Bragg grating). Fundamentally, the standing waves (modes) in the laser resonator have longitudinal parts (desired) relative to the emission direction and transverse (undesired) relative to the emission direction. When the Bragg grating is then implemented in the active zone, many small sub-resonators form. The feedback events are distributed. First, the effects of the transverse parts are suppressed further and only a few modes form in longitudinal direction in the narrow grooves; second, oppositely directed waves add up or, respectively, cancel (selection). As a result thereof, what is referred to as the Bragg wavelength experiences by far the greatest threshold amplification (natural amplification) and the DFB laser works in single-mode operation. This functioning of the DFB laser is known per se. In the inventive solution with a DFB laser, the coupling of the light waveguide can again be improved by a field transformer fashioned monolithically integrated in the semiconductor chip as well as by providing the suitable selected matching layer between the end of the light waveguide that the limiting surface of the semiconductor chip facing toward it, whereby the arrangement of the coupling can be fashioned in the form of a butt coupling or in the form of an intra-chip fiber fastening.

When employing a DBR laser (distributed Bragg reflector laser) that also serves as reception diode, it is likewise beneficial to fashion the end of the laser toward the optical fiber with low reflectivity and to fashion the other end of the laser that is arranged facing away from the optical fiber with high reflectivity. In the known DBR laser, the Bragg grating lies outside of the active zone, as a result whereof many discrete resonator lengths are provided in the laser. As a result of the Bragg condition, only a narrow band of laser modes is thereby propagatable, whereby the band is also the narrower the shorter the period length and the greater the depth of the filling. Single-mode operation with the Bragg wavelength can also be achieved here.

Given fashioning with a DBR laser, a monitor diode that is fashioned monolithically integrated in the semiconductor chip can be provided.

In another advantageous embodiment of the invention with, preferably, a DBR laser and reception diode, two closely adjacent wavelengths are employed that lie within the amplification window of the laser but can be separated by grating reflectors, for example respectively in the first reflection minimum. The first wavelength thereby serves for transmission and the second wavelength serves for reception. In the reception case, the second wavelength passes the grating reflectors at both sides of the laser diode required for laser operation unattenuated. For increasing the reception efficiency, the transmission-reception device can be fashioned such that the second wavelength is advantageously reflected by a reflector at that end of the arrangement facing away from the fiber.

In a comparable arrangement, a DFB laser and reception diode can thereby also be employed.

For realizing a ping-pong operation with electrooptical transducers with the desirable line lengths of about 10 km and about 32 subscribers at the splitter, the inventive transmission-reception device allows a significantly more cost-beneficial fashioning of, in particular, electrooptical transmission-reception transducers at the subscriber side as required for the introduction of the concept of fiber to the home, especially with PON structure (passive optical network).

DESCRIPTION OF THE PREFERRED EMBODIMENTS

Figure 1:
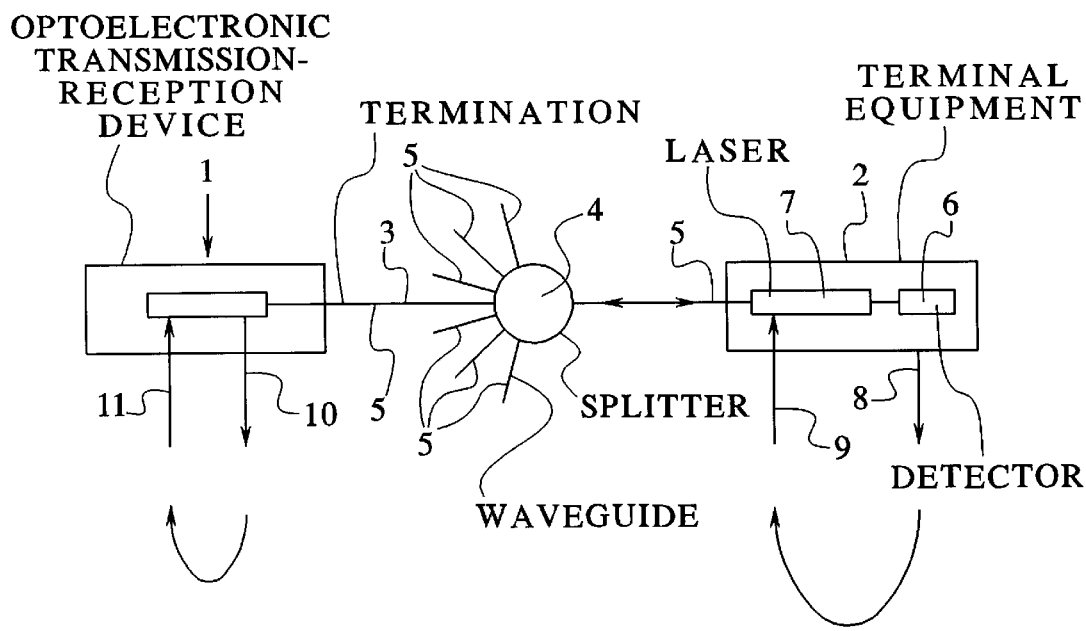
FIG. 1 is a schematic view for explaining a preferred application of an optoelectronic transmission-reception device of the invention as optoelectronic subscriber transducer at the subscriber-side end of the light waveguide.

The schematic view of FIG. 1 shows employment of an inventive optoelectronic transmission-reception device 1 at the subscriber-side terminal of a trunk line network for optical communication transmission in the form of a passive optical network. The data transmission ensues between an exchange-side terminal equipment 2 and a plurality of subscriber-side network terminations 3 that are centrally coupled to the exchange-side terminal equipment 2 in a star-shaped configuration via a splitter 4 and via light waveguides 5. The terminal equipment 2 is composed of a detector part 6 (exchange-side receiver) and of a laser part 7 (exchange-side transmitter), whereby the detector part 6 supplies an information signal 8 about the analog subscriber level from which an actuating variable 9 in digital form is derived for the laser current of the laser part 7 to be controlled. At the optoelectronic transmission-reception device 1 arranged at the subscriber side with a transmission-reception laser chip fashioned monolithically integrated, a digital actuating variable 10 for the laser current is derived due to the monitor function and supplied for the control of the transmission part according to reference character 11.

Figure 2:
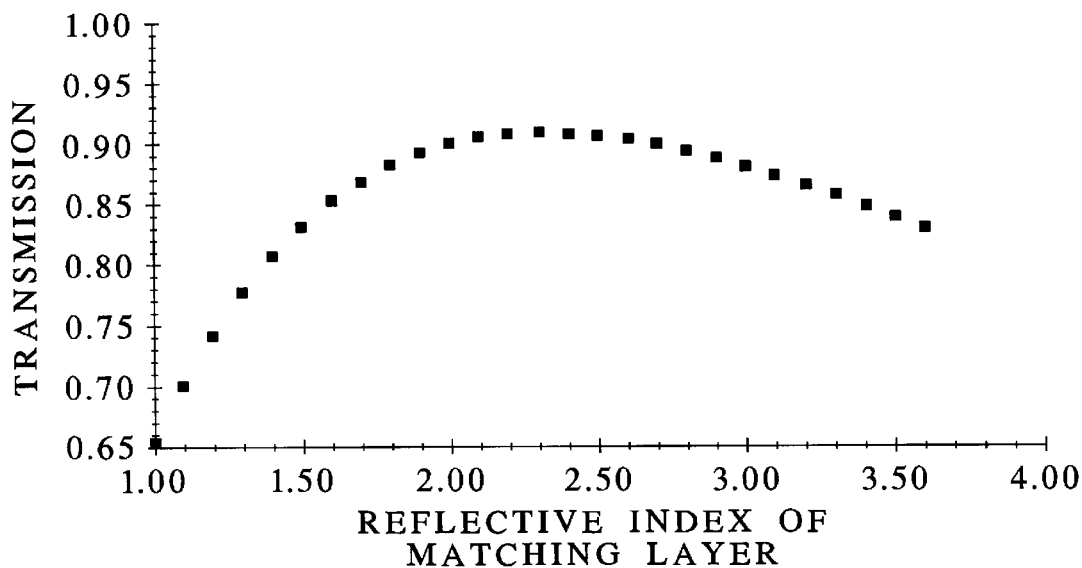
FIG. 2 depicts a curve for explaining the dependency of the transmission on the refractive index of the material of the matching layer.
Figure 3:
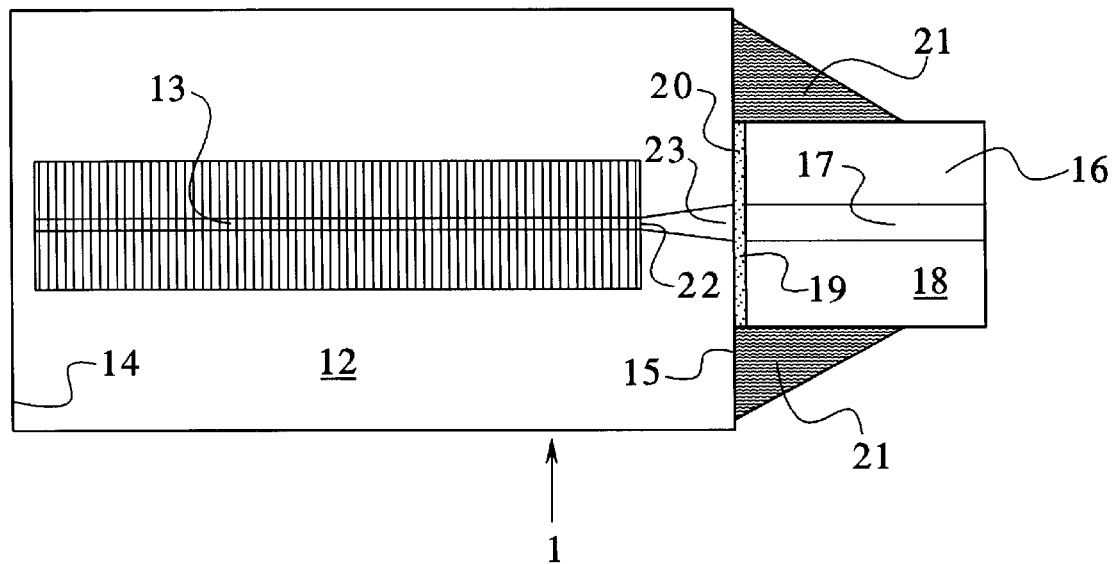
FIG. 3 is a schematic sectional view of an optoelectronic transmission-reception device according to an exemplary embodiment of the invention.

FIG. 3 shows a first exemplary embodiment of a subscriber-side optoelectronic transmission-reception device 1 in greater detail. A DFB semiconductor laser and reception diode 13, whose laser resonators are formed by the two outer limiting surfaces 14 and 15 of the semiconductor chip 12 that are arranged lying opposite one another, is fashioned monolithically integrated in a semiconductor chip comprising an InP substrate material. The laser light emitted by the semiconductor laser 13 is beamed into a light waveguide 16 coupled to the limiting surface 15 of the semiconductor 12 at the side of the light waveguide 16. In the case illustrated here, the light waveguide 16 represents a monomode fiber with a fiber core 17 of silica glass. The coupling of the fiber end 18 to the semiconductor chip 12 ensues in a butt coupling with a thin matching layer 20 of a material having a refractive index that essentially at least approximately corresponds to the geometrical average of the values of the refractive index of the material of the semiconductor laser and reception diode and of the refractive index of the light waveguide introduced between the limiting surface 15 of the semiconductor chip 12 and the end-face limiting surface 19 of the fiber end 18. As derives according to FIG. 2 from the illustration of the dependency of the transmission on the refractive index of the matching layer 20, a value for the refractive index of the matching layer that is derived from said geometrical average delivers an especially high transmission of the received laser light. Given a refractive index of 1.5 for the material of the light waveguide 16 and a refractive index of about 3.6 for the InP semiconductor material, an optimum value of the refractive index of the matching layer lies in the range from about 1.5 to about 3.0, particularly about 2.0 to about 2.5. Coming into consideration as material for the matching layer 20 is an optically transparent plastic material that, over and above enabling the required optical properties, also enables beneficial mechanical and chemical properties in view of a simple manufacture and optimally durable and stable formation of the coupling of the fiber. Reference numeral 21 indicates an ultraviolet resin compound for the mechanically stable fixing of the coupling of the fiber to the semiconductor chip. The surface of the limiting surface 15 of the semiconductor chip 12 has very low reflectivity i.e. it has such a low reflectivity that an adequate laser function is just still assured. Compared thereto, the limiting surface 14 is provided with a surface that is highly reflective for the laser light. In this way, an optimally large part of the radiation incident from the light waveguide 16 is received by the semiconductor laser and reception diode 13. A field transformer that serves for the adaptation of the optical light output field and that is arranged between the light-emitting end 22 of the semiconductor laser and the limiting surface 15 facing toward the end of the light waveguide is schematically indicated with reference numeral 23.

Figure 4:
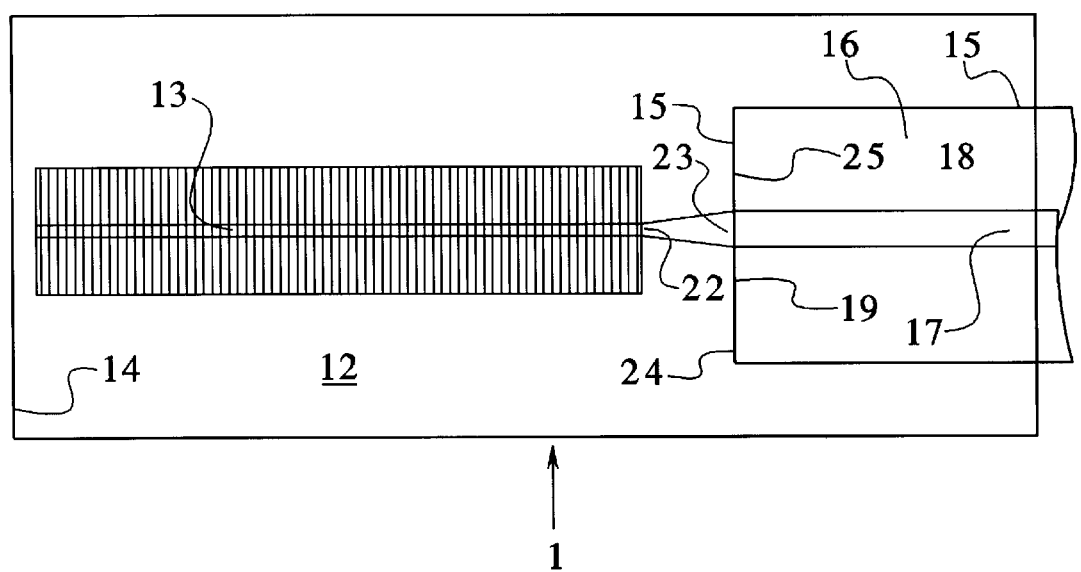
FIG. 4 is a schematic sectional view of an optoelectronic transmission-reception device according to another exemplary embodiment of the invention.

FIG. 4 shows another exemplary embodiment of an inventive optoelectronic transmission-reception device 1 with a DFB laser, whereby the coupling of the fiber end 18 to the semiconductor chip 12 is fashioned in intra-chip coupling. The fiber end 18 is thereby fastened completely within a depression or, respectively, channel 24 fashioned in the semiconductor chip 12. As shown in FIG. 4, the depression can have a shape corresponding to the cylindrical form of the light waveguide 16 or can assume a V-shaped form or similarly tapering form for better mechanical fastening. A thin matching layer 20 having the properties recited in the description of the exemplary embodiment according to FIG. 3 can again be applied between the end-face limiting surface 25 at the floor of the depression 24 of the semiconductor chip 12 and the end-face limiting surface 19 of the fiber end 18.

Figure 5:
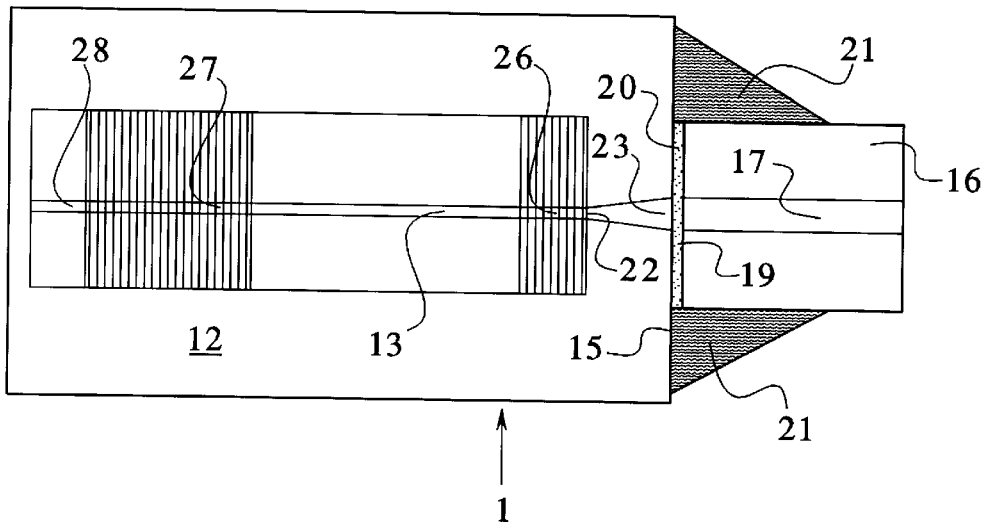
FIG. 5 is a schematic sectional view of an optoelectronic transmission-reception device according to another exemplary embodiment of the invention.

FIG. 5 shows another exemplary embodiment of an inventive optoelectronic transmission-reception device 1 with a DBR laser-reception diode 13 whose end 26 facing toward the light waveguide 16 is fashioned with low reflectivity and whose opposite end 27 is fashioned with high reflectivity. The DBR laser-reception diode 13 has a monitor diode 28 likewise fashioned integrated in the semiconductor chip 12 allocated to it, this monitor diode 28 delivering an actuating quantity for the automatic control of the transmission current of the laser from the received signal.

Figure 6:
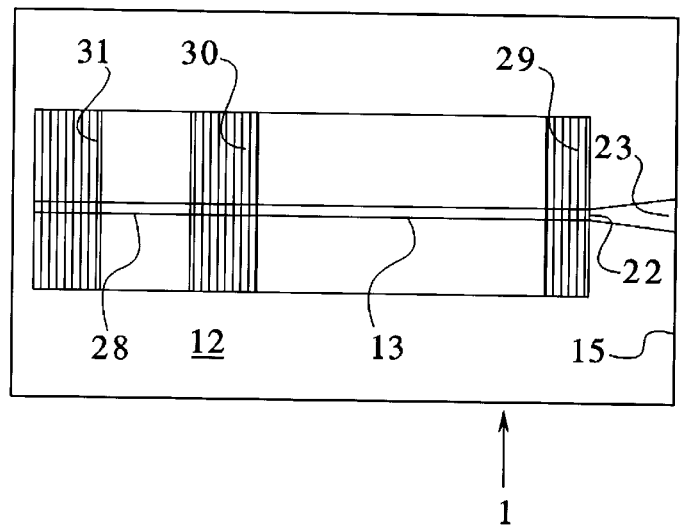
FIG. 6 is a schematic sectional view of an optoelectronic transmission-reception device according to another exemplary embodiment of the invention.
Figure 7:
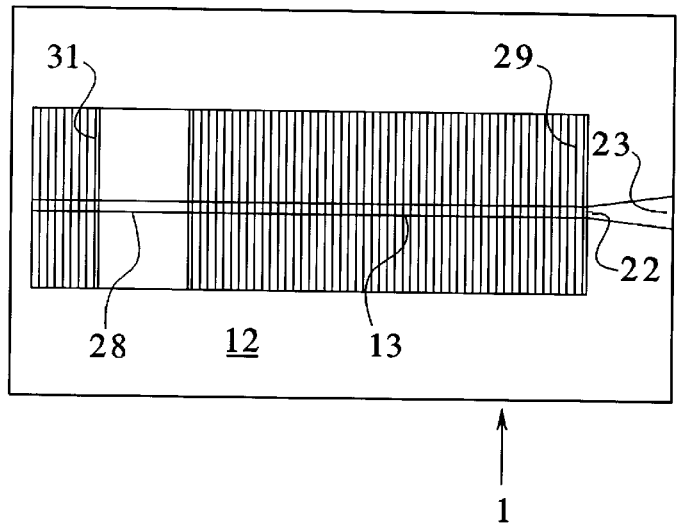
FIG. 7 is a schematic sectional view of an optoelectronic transmission-reception device according to another exemplary embodiment of the invention.

FIG. 6 and FIG. 7 shows especially advantageous embodiments with a laser and reception diode 13 wherein two closely adjacent wavelengths are employed that lie in the amplification window of the laser, but that can be separated with reflectors. The wavelength 1 thereby serves for the transmission and the wavelength 2 for the reception. In the embodiment of FIG. 6 with a DBR laser and reception diode 13 and a monitor diode 28 following thereupon, reflectors 29, 30 and 31 in the form of grating reflectors are fashioned within the semiconductor chip 12 or, respectively, are of such a nature that the radiation with the wavelength $\lambda 1$ serving for the transmission is mirrored at the laser reflector 29 with low reflectivity and at the laser reflector 30 with high reflectivity and the radiation with the wavelength $\lambda 2$ serving for the reception is highly reflected at the reflector 31 of the monitor diode 28 and is essentially not reflected at the laser reflectors 29 and 30. In this way, the light radiation with the wavelength $\lambda 2$ can pass the grating reflectors 29 and 30 at both sides of the laser diode required for the laser operation unattenuated in the reception case and can be reflected at the end of the arrangement by the reflector 31 for enhancing the reception efficiency.

FIG. 7 shows a comparable arrangement upon employment of a DFB laser and reception diode 13 and a monitor diode 28.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An optoelectronic transmission-reception device, comprising:

semiconductor laser and reception diode monolithically integrated in a semiconductor chip;

the semiconductor chip having first and second outer limiting surfaces arranged opposite one another, the surfaces forming a laser resonator for the semiconductor laser;

a light waveguide coupled to the first limiting surface of the semiconductor chip at a light waveguide side, laser light emitted by the semiconductor laser being incident into the light waveguide;

a coupling of the light waveguide to the semiconductor laser and reception diode being structured, and the first limiting surface of the semiconductor chip at the light waveguide side having a configuration such that, given a low reflectivity of the laser emission emitted by the laser that is required for assurance of the laser function, an optimally large part of the radiation received via the light waveguide is incident into the semiconductor laser and reception diode; and a field transformer for adapting an optical light output field from spatial dimensions of a light exit face of the laser to an entry face of the coupled light waveguide, the field transformer being between a light-emitting end of the semiconductor laser and the first limiting surface of the semiconductor chip facing toward the end of the light waveguide.

2. The optoelectronic transmission-reception device according to claim 1, wherein the first limiting surface of the semiconductor chip at the light waveguide side has a substantially non-reflective surface or, respectively, a surface having substantially complete optical transmissivity for radiation received via the light waveguide.

3. The optoelectronic transmission-reception device according to claim 1 wherein the coupling of the light waveguide to the first limiting surface of the semiconductor chip at the light waveguide side has a thin matching layer applied to a surface of the first limiting surface of the semiconductor chip at the light waveguide side that faces toward the light waveguide, said matching layer being of such a nature or, respectively, having such a material that an optimally large part of the radiation received via the light waveguide is incident into the semiconductor laser and reception diode.

4. The optoelectronic transmission-reception device according to claim 3, wherein the material of the thin matching layer applied to that surface of the first limiting surface of the semiconductor chip at the light waveguide side that faces toward the light waveguide has a refractive index of at least approximately a geometrical average of values of a refractive index of the semiconductor laser and reception diode and of a refractive index of the material of the light waveguide.

5. The optoelectronic transmission-reception device according to claim 4 wherein the refractive index of the material of the matching layer has a value from about 1.5 to about 3.0 given a refractive index of the semiconductor chip material of about 3.3 to about 3.8 and a reflective index of the material of the light waveguide of about 1.4 to about 1.6.

6. The optoelectronic transmission-reception device according to claim 3, wherein the material of the matching layer has a low optical absorption coefficient.

7. The optoelectronic transmission-reception device according to claim 1 wherein a surface of the first limiting surface of the semiconductor laser facing away from the light waveguide is highly reflective for the laser light.

8. The optoelectronic transmission-reception device according to claim 1, wherein the device further comprises a monitor diode for control of output power of the semiconductor laser, the monitor diode being integrated on the semiconductor chip.

9. The optoelectronic transmission-reception device according to claim 1, wherein the semiconductor laser and reception diode fashioned monolithically integrated in the semiconductor chip has a laser with a DFB or a DBR arrangement with a Bragg grating.

10. The optoelectronic transmission-reception device according to claim 1, wherein the semiconductor laser and reception diode fashioned monolithically integrated in the semiconductor chip operates with light of a first wavelength in a transmission mode and operates with light of a second wavelength in the reception mode, the second wavelength being different from the first wavelength.

11. The optoelectronic transmission-reception device according to claim 10, wherein the first wavelength and the second wavelength lie in close proximity to one another.

12. The optoelectronic transmission-reception device according to claim 10 wherein the device further comprises a grating reflector that is integrated in the semiconductor chip for separating the two lights with the first and second wavelengths.

13. The optoelectronic transmission-reception device according to claim 10, wherein in a reception mode, the light of the second wavelength passes the grating reflectors at both sides of the laser diode required for substantially unattenuated laser operation.

14. The optoelectronic transmission-reception device according to claim 10, wherein the device further comprises a reflector arrangement that has a high reflectivity for the light of the second wavelength, the reflector arrangement being at an end of the semiconductor laser.

15. The optoelectronic transmission-reception device according to claim 1, wherein the material of the semiconductor chip is a III-V semiconductor.

16. The optoelectronic transmission-reception device according to claim 1, wherein the material of the semiconductor chip is InGaAsP on an InP substrate.

17. An optoelectronic transmission-reception device, comprising:

semiconductor laser and reception diode monolithically integrated in a semiconductor chip;

the semiconductor chip having first and second outer limiting surfaces arranged opposite one another, the surfaces forming a laser resonator for the semiconductor laser;

a light waveguide coupled to the first limiting surface of the semiconductor chip at a light waveguide side, laser light emitted by the semiconductor laser being incident into the light waveguide;

a coupling of the light waveguide to the semiconductor laser and reception diode being structured, and the first limiting surface of the semiconductor chip at the light waveguide side having a configuration such that, given a low reflectivity of the laser emission emitted by the laser that is required for assurance of the laser function, an optimally large part of the radiation received via the light waveguide is incident into the semiconductor laser and reception diode;

the coupling of the light waveguide to the first limiting surface of the semiconductor chip having a thin matching layer applied to a surface of the first limiting surface of the semiconductor chip at the light waveguide side that faces toward the light waveguide; and a field transformer for adapting an optical light output field from spatial dimensions of a light exit face of the laser to an entry face of the coupled light waveguide, the field transformer being between a light-emitting end of the semiconductor laser and the first limiting surface of the semiconductor chip facing toward the end of the light waveguide, the field transformer being structured to substantially limit dissipated power of the laser emission.

18. The optoelectronic transmission-reception device according to claim 17, wherein a material of the thin matching layer applied to that surface of the first limiting surface of the semiconductor chip at the light waveguide side that faces toward the light waveguide has a refractive index of approximately a geometrical average of values of a refractive index of the semiconductor laser and reception diode and of a refractive index of the material of the light waveguide, and wherein a surface of the first limiting surface of the semiconductor laser facing away from the light waveguide is highly reflective for the laser light.

19. An optoelectronic transmission-reception device, comprising:

semiconductor laser and reception diode monolithically integrated in a semiconductor chip;

the semiconductor chip having first and second outer limiting surfaces arranged opposite one another, the surfaces forming a laser resonator for the semiconductor laser;

a light waveguide coupled to the first limiting surface of the semiconductor chip at a light waveguide side, laser light emitted by the semiconductor laser being incident into the light waveguide;

a coupling of the light waveguide to the semiconductor laser and reception diode being structured, and the first limiting surface of the semiconductor chip at the light waveguide side having a configuration such that, given a low reflectivity of the laser emission emitted by the laser that is required for assurance of the laser function, an optimally large part of the radiation received via the light waveguide is incident into the semiconductor laser and reception diode;

the semiconductor laser and reception diode having a transmission mode and a reception mode, light having a first wavelength being used in the transmission mode and light having a second wavelength being used in the reception mode, the first wavelength and the second wavelength being in close proximity to one another and being different from one another; and a field transformer for adapting an optical light output field from spatial dimensions of a light exit face of the laser to an entry face of the coupled light waveguide, the field transformer being between a light-emitting end of the semiconductor laser and the first limiting surface of the semiconductor chip facing toward the end of the light waveguide, the field transformer being structured to substantially limit dissipated power of the laser emission.

* * * * *